United States Patent [19]

Bandoh

[11] 4,347,211
[45] Aug. 31, 1982

[54] PROCESS AND APPARATUS FOR MOLDING PLASTICS

[76] Inventor: Kazuo Bandoh, No. 81-8, Tōyama, Momoyama-chō, Fushimi-ku, Kyōto-shi, Japan

[21] Appl. No.: 180,932

[22] Filed: Aug. 25, 1980

[30] Foreign Application Priority Data

Aug. 24, 1979 [JP] Japan .................... 54/108424

[51] Int. Cl.³ ........................................ B29G 3/00
[52] U.S. Cl. ........................ 264/297; 264/328.4; 264/328.9; 425/544
[58] Field of Search ............ 425/544; 264/297, 328.4, 264/328.5, 328.9

[56] References Cited

U.S. PATENT DOCUMENTS

| | | | |
|---|---|---|---|
| 1,492,906 | 5/1924 | Thomson | 264/328.5 X |
| 2,130,254 | 9/1938 | Visman | 264/328.5 X |
| 3,483,287 | 12/1969 | Davis | 264/328.5 X |
| 3,763,300 | 10/1973 | Spanjer | 264/297 X |
| 3,764,248 | 10/1973 | Hall | 425/544 |

FOREIGN PATENT DOCUMENTS 38-24716  11/1963  Japan ................................ 425/544

Primary Examiner—Thomas P. Pavelko
Attorney, Agent, or Firm—Larson and Taylor

[57] ABSTRACT

Molding apparatus including an upper and lower mold half and having a plurality of mold cavities is improved by eliminating runners and gates. An open bore adjacent each mold cavity serves as a separate pot for each cavity. A plunger moveable in each bore is used to inject plastics material directly from the bore into the mold cavity into which the bore opens. A molding method is similarly improved by injecting the plastics material directly from the separate bores into the individual mold cavities into which the bores open.

5 Claims, 9 Drawing Figures

PRIOR ART

PRIOR ART

PROCESS AND APPARATUS FOR MOLDING PLASTICS

BACKGROUND OF THE INVENTION

Conventional apparatus for molding plastics comprise an upper mold and a lower mold which include opposed blocks each having pairs of opposed cavities in each of the fitting surfaces of the molds. An auxiliary runner is formed between the opposed cavities and communicates with the cavities through gates. The center block of the apparatus has in its center a cull portion from which main runners branch out to communicate with the auxiliary runners.

When semiconductor chips are to be enclosed with plastics by the molding apparatus, lead frames carrying semiconductor chips are set in place between the fitting surfaces of the upper and lower molds, and the molds are thereafter clamped together. A preheated molding material, such as epoxy resin or like thermosetting synthetic resin, is fed to a pot in the center of the upper mold and plasticized in the pot by being subjected to pressure with a plunger. The plasticized material is injected into the cavities through the main runners, auxiliary runners and gates and is molded with the semiconductor chips enclosed with portions of the material.

When the resin material is thus molded with the apparatus described above, portions of the material are also molded in the cull portion, main runners, auxiliary runners and gates, so that the operation affords a seriously reduced yield of about 65% if highest, or as low as 20% or lower in extreme cases. Since the molding material is thermosetting and is therefore not reusable, the waste of the material results in a great economical loss.

SUMMARY OF THE INVENTION

The present invention relates to a process and an apparatus for molding plastics, especially for enclosing semiconductor chips with plastics by molding.

An object of the invention is to provide a process and an apparatus for molding plastics in which the bores for passing the plungers for injecting the molding material into the cavities are used as pots as opened directly to the cavities in communication therewith, and by which molded articles of plastics can be obtained very economically in remarkably improved yields with greatly reduced waste of the material.

Another object of the invention is to provide a process for molding plastics very efficiently with use of an apparatus which has cavities and plungers provided for the cavities individually and extending through bores each of which has an end portion opened directly to the corresponding cavity and serving as a pot therefor, the apparatus thus being adapted to have cavities also in its center block so as to have an increased number of cavities although the mold assembly is limited in size.

Another object of the invention is to provide an apparatus for molding plastics which has cavities and plungers provided for the cavities individually and extending through bores each having an end portion, the end portion being opened directly to the corresponding cavity and serving as a pot for receiving the molding material so that the molding material can be injected into the cavities directly and accurately without necessitating any runner or cull portion.

Still another object of the invention is to provide a molding apparatus of the above construction which is very advantageously usable for thermosetting resins which are not reusable as molding materials.

DESCRIPTION OF THE PREFERRED EMBODIMENTS

Figure 1:
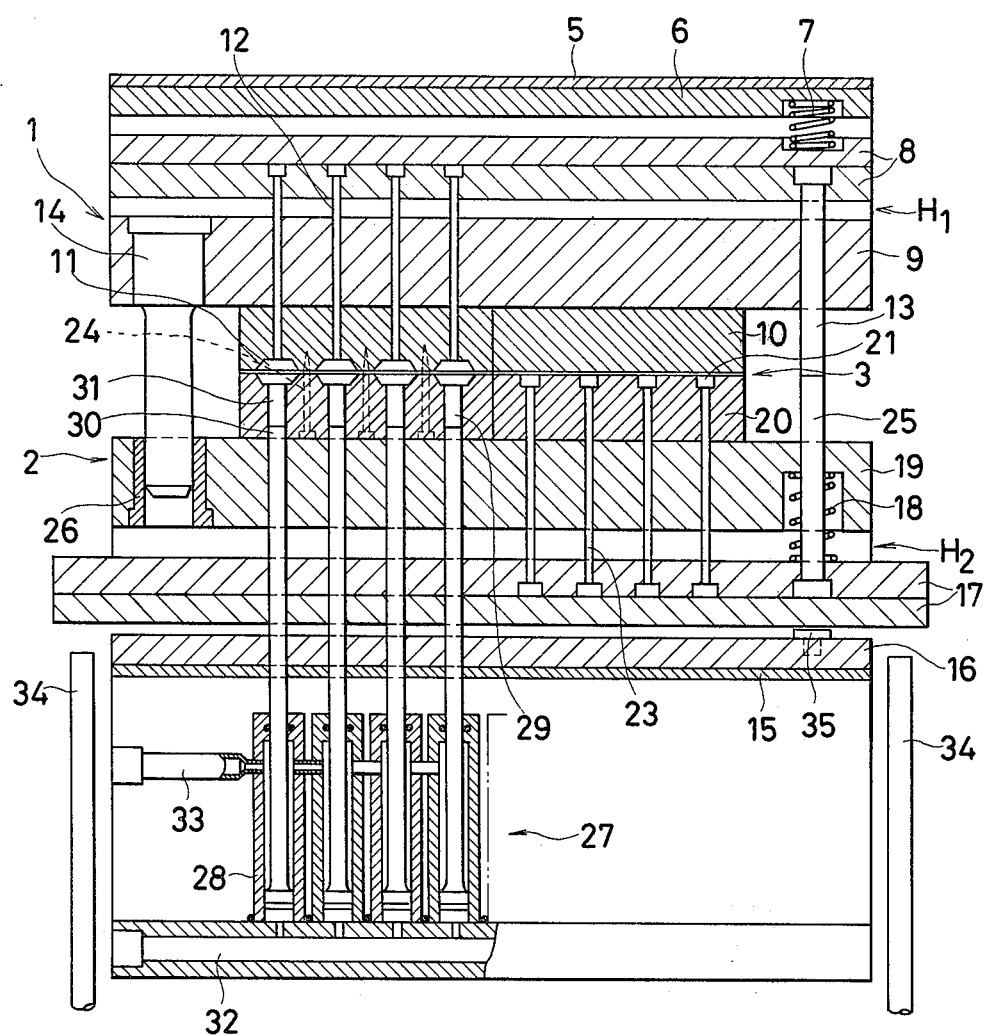
FIG. 1 is a view in vertical section schematically showing a molding apparatus of the invention.

FIGS. 1 to 5 show an apparatus embodying the invention for enclosing semiconductors with plastics by molding.

The molding apparatus consists chiefly of a stationary upper mold 1 and a movable lower mold 2. Lead frames 4 having semiconductor chips attached thereto are placed between the fitting surfaces 3 of the molds to enclose the chips with a thermoplastic resin by molding.

The stationary upper mold 1 and the movable lower mold 2 will be described in detail with reference to FIG. 1.

The upper mold 1 has the following construction. An upper mold attaching plate 6 is fixed to the under side of a heat insulating plate 5. An upper ejector plate 8 which is movable into or out of contact with the plate 6 is disposed under the plate 6 with a compression spring 7 interposed therebetween. An upper mold support plate 9 is disposed under the upper ejector plate 8 as spaced therefrom a specified distance H1. An upper mold main body 10 is fixed to the lower side of the support plate 9.

The upper mold main body 10 includes a plurality of blocks each formed in its lower surface with pairs of opposed cavities 11 arranged on both sides of the center line of the block. Each of these cavities is in pair with the corresponding cavity in the lower mold main body to be described later. The cavities are formed substantially in the fitting surface 3.

Extending through the support plate 9 and the main body 10 are parallel upper ejector pins 12 each having a head fixed to the ejector plate 8 and a free end which is adapted to project from the main body 10 in the center of the cavity 11.

An upper return pin 13 fixed at its head to the ejector plate 8 is disposed on one side of the mould main body 10 externally thereof. The return pin 13 extends through the support plate 9 and has a free end projecting from the lower surface of the support plate 9 by a length corresponding to the thickness of the main body 10.

Disposed outside the main body 10 on the other side thereof opposite to the return pin 13 is a guide pin 14 for positioning the upper and lower molds relative to each other. The guide pin 14 which is parallel to the return pin 13 has a head fixed to the upper mold support plate 9 and a free end extending from the lower surface of the support plate 9 and having a length not smaller than the combined thickness of the upper and lower mold main bodies which are clamped together.

The movable lower mold 2 chiefly comprises a heat insulating plate 15, a lower mold attaching plate 16, a lower ejector plate 17, a support plate 19 and a lower mold main body 20.

Stated more specifically with reference to FIG. 1, the attaching plate 16 is mounted on the heat insulating plate 15. Disposed above the plate 16 is the lower ejector plate 17 with a stopper pin 35 provided therebetween.

The support plate 19 is disposed above the lower ejector plate 17 as spaced therefrom by a distance H2. The lower mold main body 20 is fixedly mounted on the support plate 19. A compression spring 18 is interposed between the lower ejector plate 17 and the lower mold support plate 19. These components are arranged in the same manner as those of the upper mold described.

Figure 2:
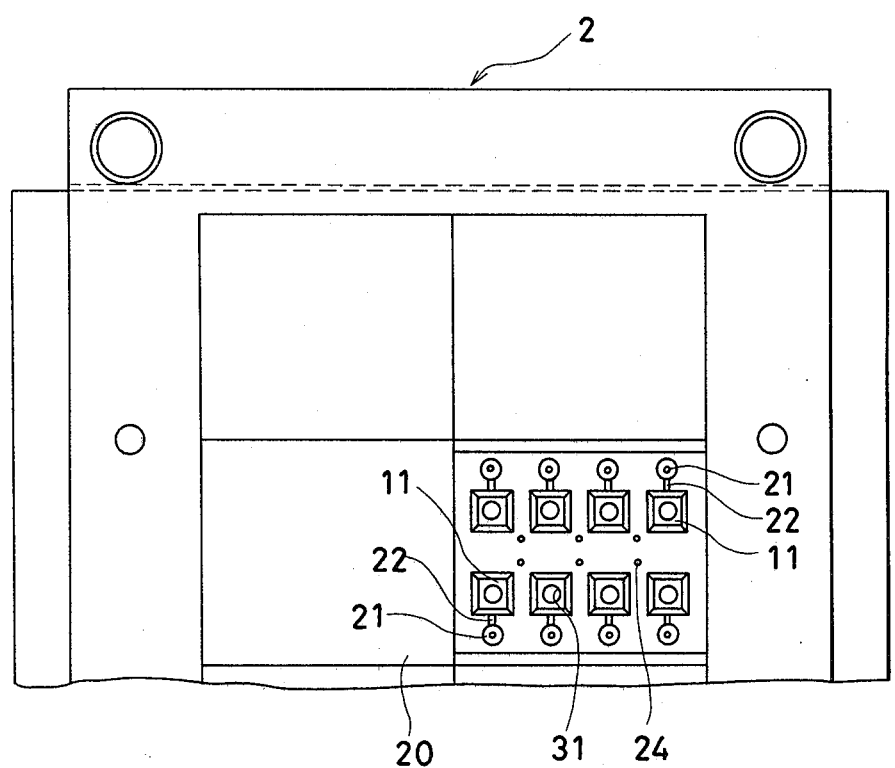
FIG. 2 is a plan view showing part of the upper surface of a lower mold included in the apparatus.
Figure 3:
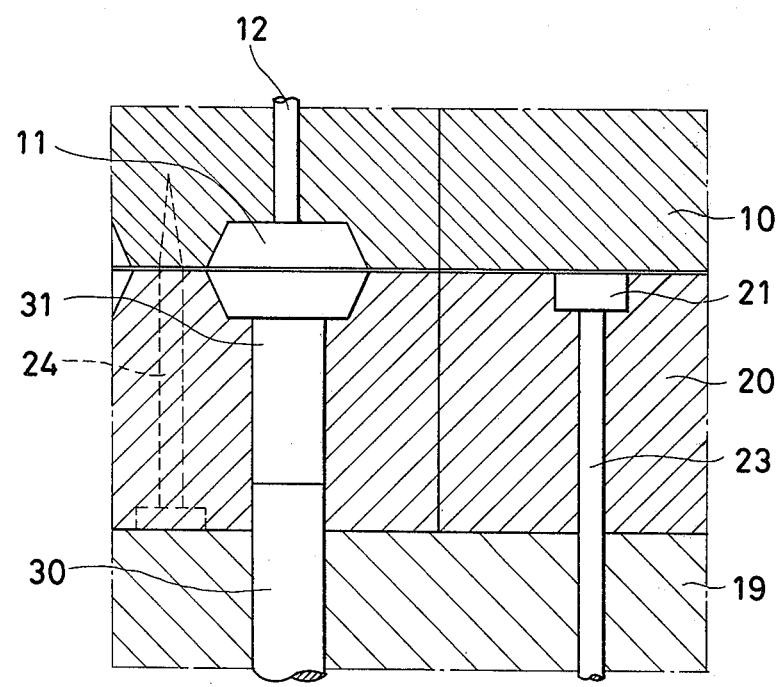
FIG. 3 is a fragmentary enlarged view in vertical section showing upper and lower molds as fitted together.

As seen in FIG. 2, the lower mold main body 20 includes a plurality of blocks each formed in its upper surface with pairs of opposed cavities 11 arranged on both sides of the center line of the block in the same manner as the cavities in the upper mold main body 10. Thus the cavities 11 formed substantially in the fitting surfaces 3 of the upper and lower mold main bodies 10 and 20 define the shape of the product to be molded.

Each of the cavities 11 for receiving the molding material is provided with a portion 21 for accommodating an excess of the molding material. Like the cavity 11, the accommodating portion 21 is formed independently in the upper surface of the lower mold main body 20 and communicating with the corresponding cavity 11 through a communicating portion 22 (see FIG. 2).

Lower ejector pins 23 fixed at their lower ends to the lower ejector plate 17 are arranged in parallel and extend through the lower mold support plate 19. The heads of the pins 23 are movable into or out of the accommodating portions 21 formed in the lower mold main body 20.

While the lead frame 4 carrying semiconductor chips is placed on the lower mold main body 20 for each cavity block, pins 24 are implanted in the main body 20 for positioning the lead frame in place.

In opposed relation to the upper return pin 13, a lower return pin 25 is mounted on the movable lower mold 2. The lower mold support plate 19 is provided with a guide bush 26 which coacts with the guide pin 14 when the mold assembly is clamped or opened.

As seen in FIG. 1, the lower mold is provided at a suitable portion with a double acting hydraulic cylinder unit 27 for injecting the molding material into the cavities 11. The cylinder unit 27 comprises oil cylinder tubes 28 corresponding in position and number to the cavities 11 in the lower mold, and plungers 30 oil-tightly fitting in the tubes slidably.

The cylinder tube 28 is arranged vertically below the corresponding cavity 11. A bore 29 coaxial with the tube 28 extends through each of the lower mold main body 20, support plate 19, lower ejector plate 17, attaching plate 16 and heat insulating plate 15. The plunger 30 extends through the bore 29 slidably. The space in the bore 29 above the projecting end of the plunger 30 serves as a pot 31 for supplying the molding material. Thus such pots 31 are formed independently of one another. The opening of the pot 31 is in direct communication with the corresponding cavity 11.

Figure 4:
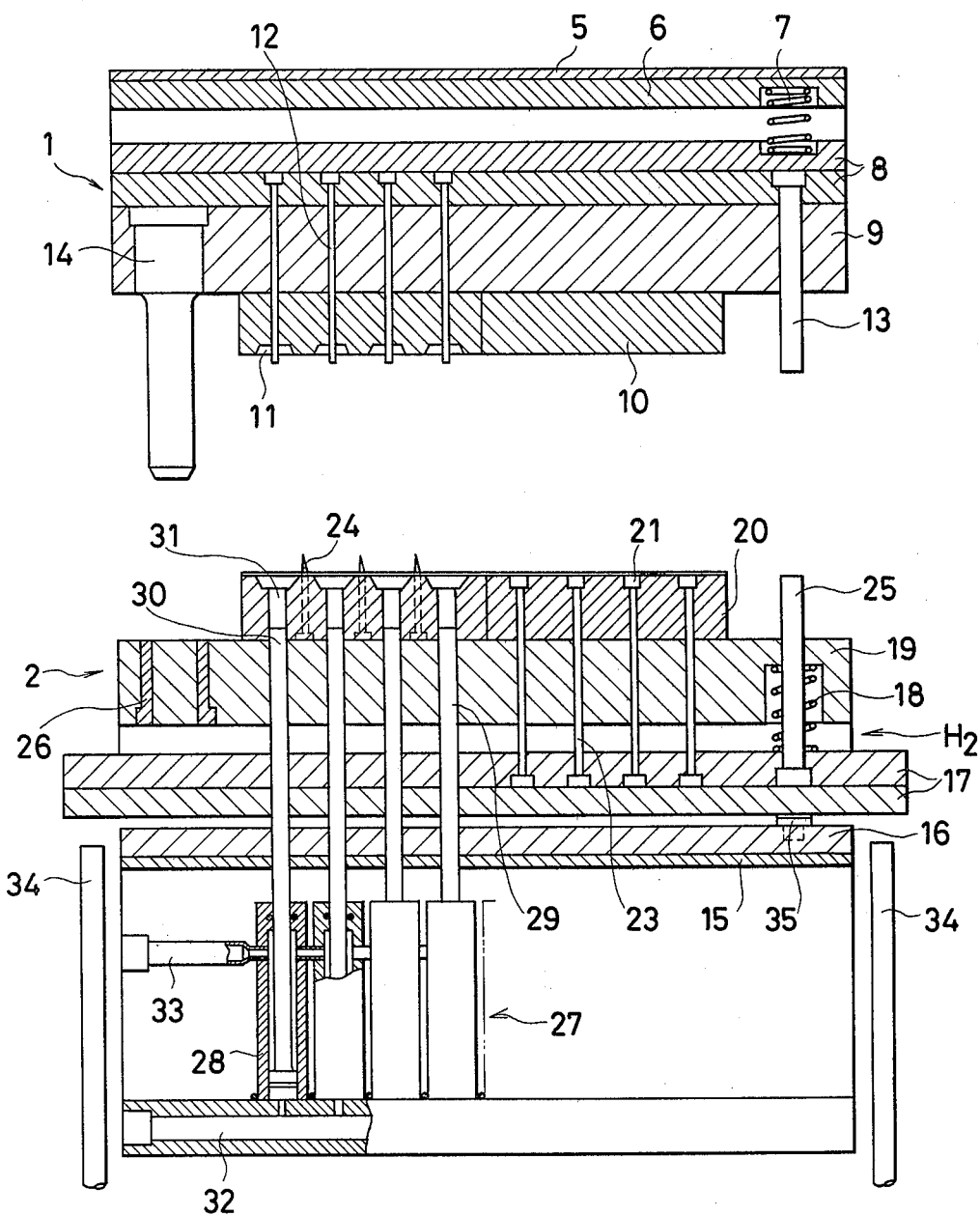
FIG. 4 is a view in vertical section schematically showing the molding apparatus of the invention with its molds opened.
Figure 5:
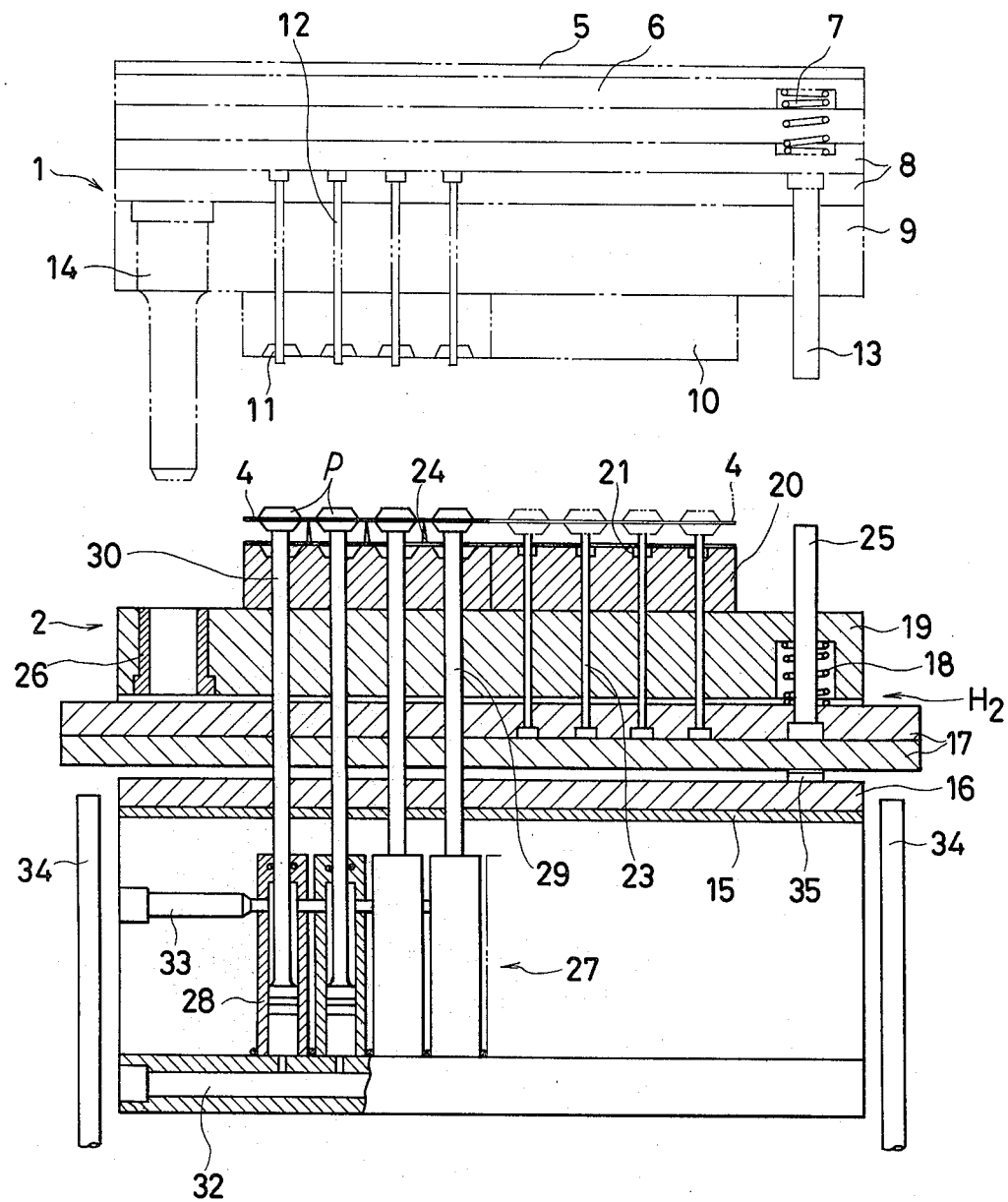
FIG. 5 is a view in vertical section schematically showing the molding apparatus of the invention with a molded article ejected from the lower mold.

With reference to FIGS. 1, 4 and 5, the cylinder unit 27 has an oil inlet channel 32 for moving the plungers forward and an oil inlet channel 33 for moving the plungers backward. The oil inlet channels 32 and 33 communicate with the cylinder tubes 28 individually and serve for these tubes as common oil pressure sources for the cylinder unit 27.

The lower mold is provided with an unillustrated ejector unit which is coupled to a plurality of ejector bars 34.

Figure 6:
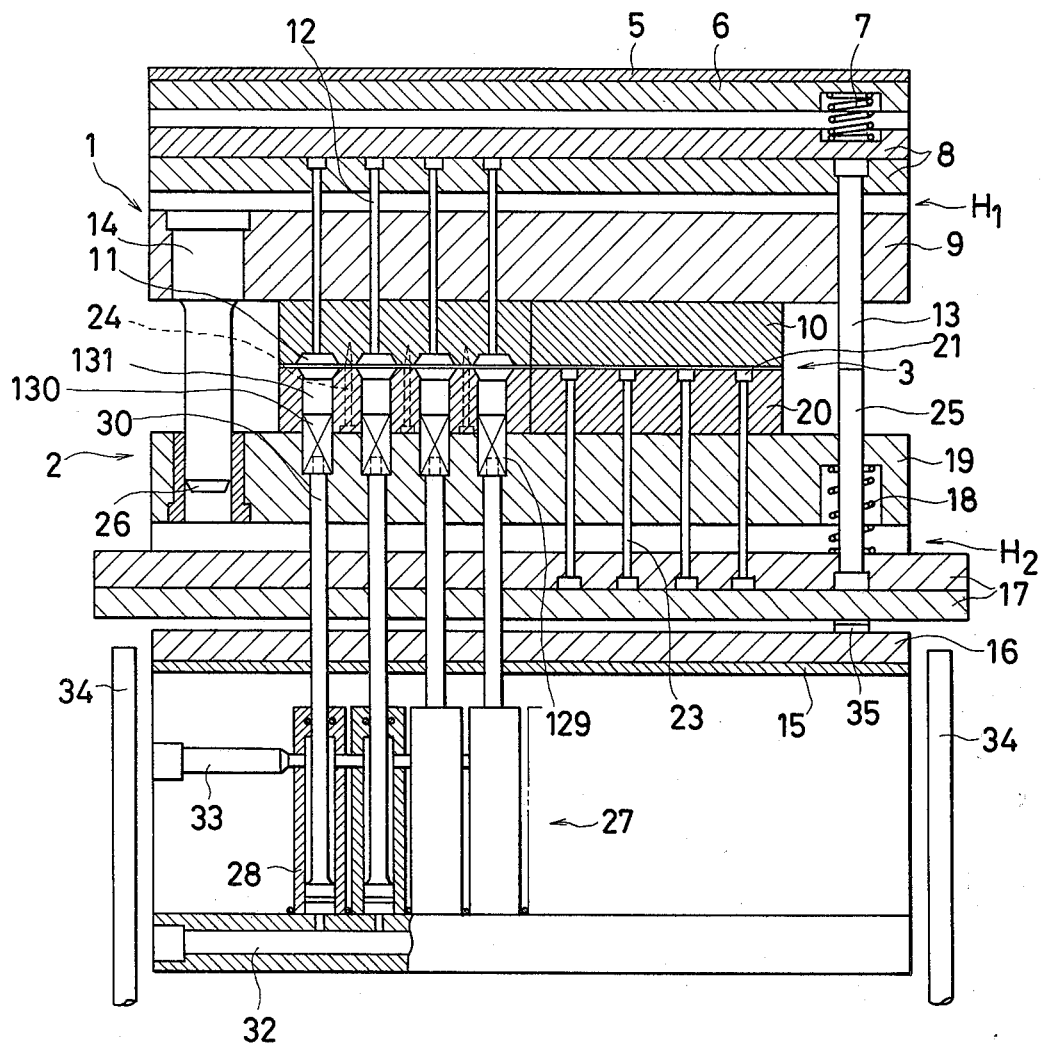
FIG. 6 is a view in vertical section schematically showing another molding apparatus embodying the invention.
Figure 7:
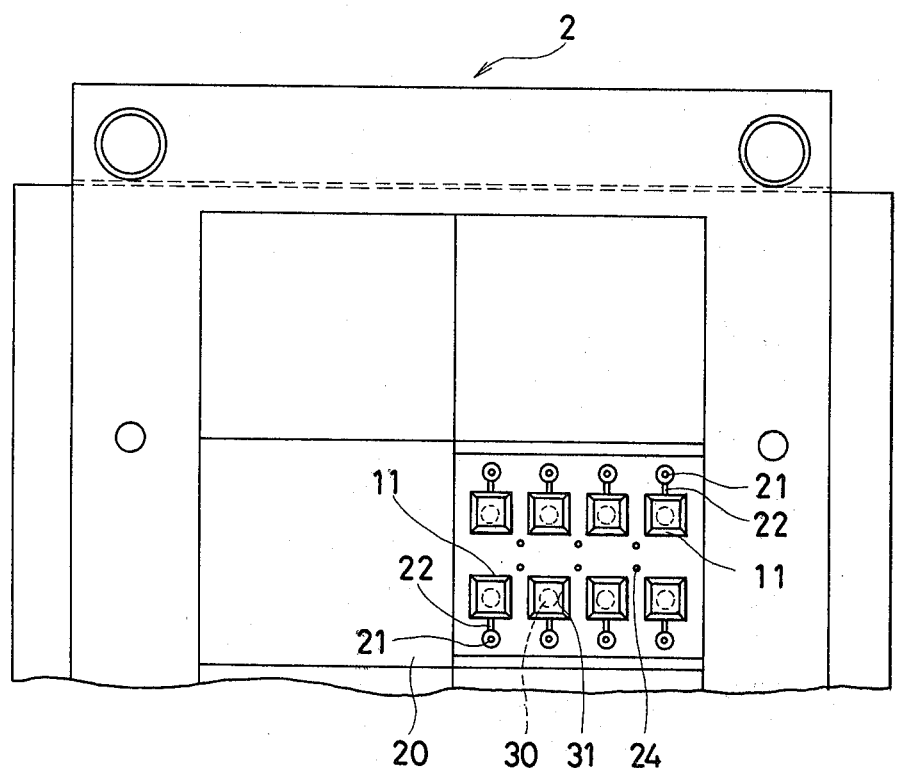
FIG. 7 is a plan view showing a portion of the upper surface of the lower mold thereof.

FIGS. 6 and 7 show another molding apparatus embodying the invention. Each of solid cylindrical plunger 30 is provided at its upper end with a block 130 of square cross section having one side longer than the diameter of the plunger. The block 130 is joined to the plunger upper end detachably, for example, by screw-thread engagement. The block 130 is slidably fitted in a bore 129 approximately in conformity with the shape and size of the cavity 11 and serving as a supply pot 131 directly opened to and communicating with the cavity 11. When the mold assembly is opened with the plunger extended, the block 130 is replaceable. The second embodiment has the same construction as the first with the exception of the above-mentioned feature. Throughout the drawings showing these embodiments, like parts are referred to by like reference numerals.

The molding apparatus of the foregoing construction will be used in the following manner for enclosing semiconductors with a thermosetting resin by molding.

The upper and lower molds 1 and 2 are opened to the state shown in FIG. 4. A lead frame 4 having semiconductor chips is placed on the upper surface of the lower mold main body 20 for each block. The molding material, such as epoxy resin or like thermosetting synthetic resin, is preheated and fed to the pots 31 or 131.

The molds are then clamped together by the usual means to the state shown in FIG. 1, in which the lead frames 4 are located between the fitting surfaces of the upper and lower molds 1 and 2 with the semiconductor chips accurately positioned relative to the cavities by virtue of provision of the positioning pins 24.

With the molds clamped together, oil is fed to the inlet channel 32 for the hydraulic cylinder unit 27 and forced into the cylinder tubes 28 to raise the plungers 30 for forward movement.

Since the upper ends of the bores 29 serve as pots 31 individually communicating with the cavities 11, the sliding upward movement of the plungers 30 through the bores 29 pressurizes the molding material plasticized in the pots 31 and immediately injects the material into the cavities 11 to enclose the semiconductor chips with the material for molding.

The molds are opened after the material has been cured, whereupon the molded pieces P are released from the upper mold by the ejector pins 12 which are forced down by the action of the compression spring 7. At the same time, the lower ejector pins 23 are forced up together with the lower ejector plate 17 by the ejector bars 34 coupled to the ejector unit, whereby the molded pieces are completely released also from the lower mold. Consequently the molded pieces are released from the cavities 11 along with the lead frame 4 as seen in FIG. 5. The desired product can thus be molded.

On completion of the above operation, the ejector bars 34 are lowered, and with this movement, the lower ejector plate 17 and lower ejector pins 23 are lowered to their original position. On the other hand, oil is fed to the inlet channel 33 to return the plungers 30 downward to the original position. The apparatus thus finishes one cycle of molding operation and is made ready for the next cycle. With the second embodiment shown in FIGS. 6 and 7, the block 130 which is removable can be replaced when the end face thereof for molding the material or its sliding portion has been worn away.

Figure 8:
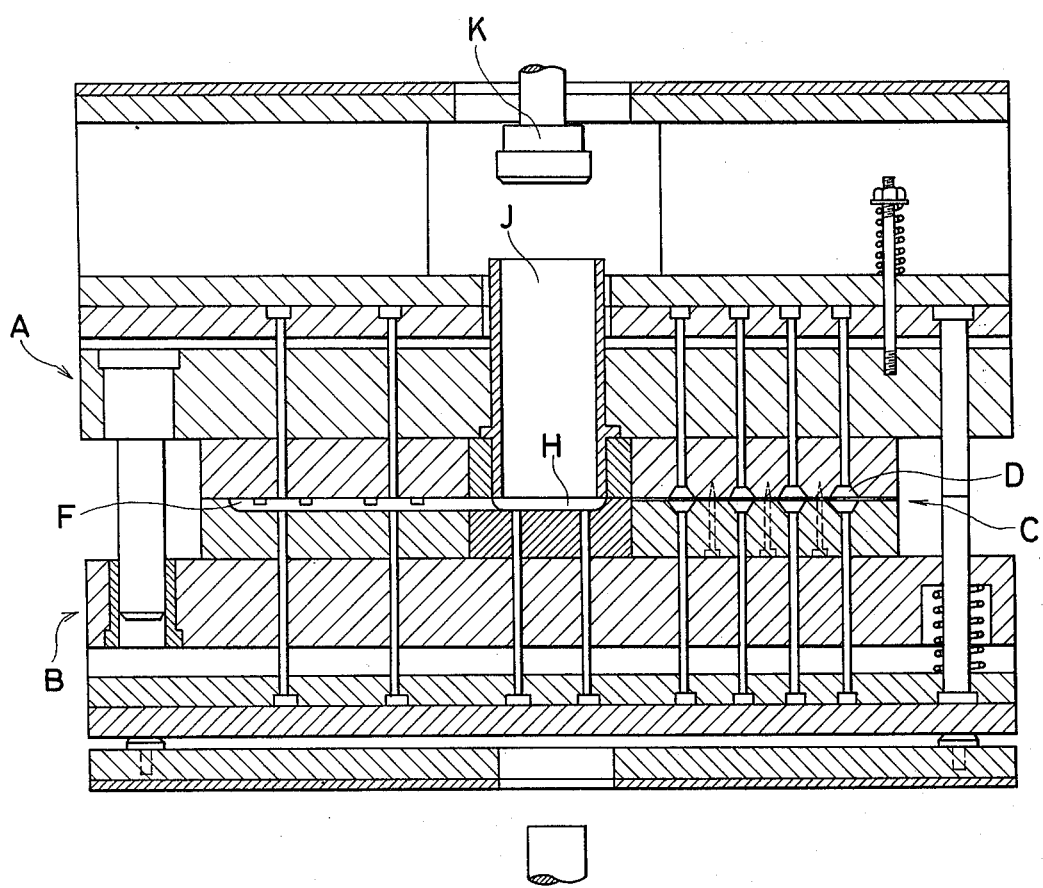
FIG. 8 is a view in vertical section schematically showing a conventional molding apparatus.
Figure 9:
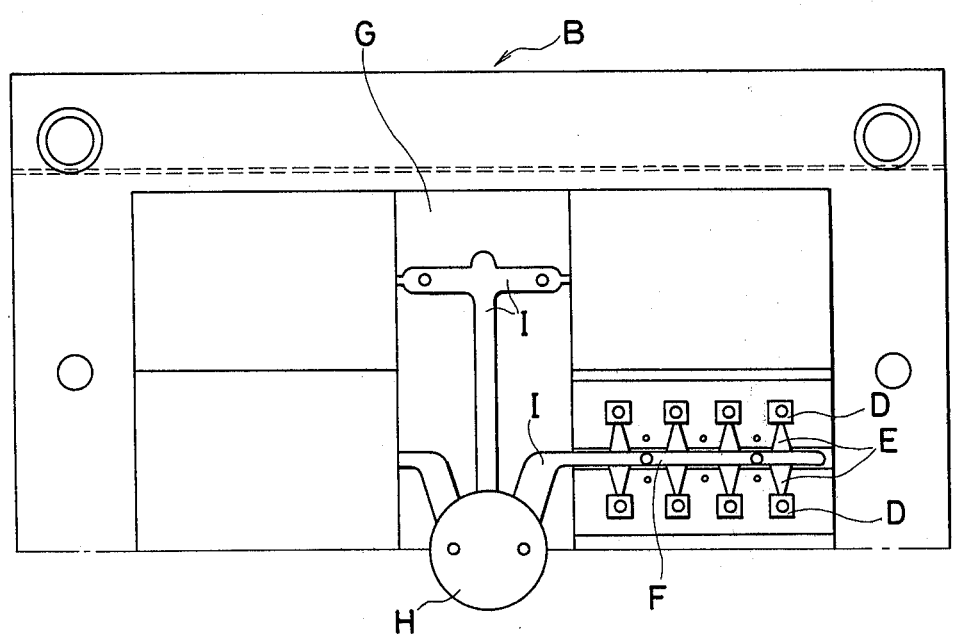
FIG. 9 is a plan view showing a portion of the upper surface of the lower mold thereof.

The features and advantages of the molding apparatus of the invention as well as of the process described above will become more apparent with reference to the conventional apparatus shown in FIGS. 8 and 9.

The apparatus shown in FIGS. 8 and 9 for molding plastics comprises an upper mold A and a lower mold B which include opposed blocks each having pairs of opposed cavities D in each of the fitting surfaces C of the molds. An auxiliary manner F is formed between the opposed cavities D and communicates with the cavities D through gates E. The center block G of the apparatus has in its center a cull portion H from which main runners I branch out to communicate with the auxiliary runners F.

When semiconductor chips, for example, are to be enclosed with plastics by the conventional apparatus, lead frames having semiconductor chips are set in place between the fitting surfaces C of the upper and lower molds, and the molds are thereafter clamped together. A preheated thermosetting synthetic resin is fed to a pot J in the center of the upper mold and plasticized in the pot J by being subjected to pressure with a plunger K. The material is injected into the cavities through the main runners I, auxiliary runners F and gates E and is molded with the semiconductor chips enclosed with portions of the material.

With the conventional molding apparatus, therefore, the molding material is fed to the cavities through the main runners I, auxiliary runners F, cull portion H and gates F and is molded also in these portions. This entails great waste of the material, while the increased resistance to the injection of the material requires a prolonged period of time for the molding cycle.

With the apparatus of this invention which includes none of main runner, auxiliary runner, cull portion and gate, the molding material in the pots can be injected directly into the cavities, with the result that the waste of the material can be greatly reduced by an amount corresponding to the amount filling the main runner, auxiliary runner, cull portion and gate to achieve a remarkably improved yield. Molded articles of plastics can therefore be obtained economically. This is an especially great advantage in molding thermosetting resins which are not reusable.

The molding apparatus of this invention is further adapted to have cavities in the center block which is conventionally provided with a single pot of large capacity and main runners. Thus the apparatus has a correspondingly increased number of cavities while involving reduced resistance against the injection of the molding material. These features assure a highly efficient molding operation.

The present invention is not limited to the enclosing of semiconductors by plastics molding but is widly useful for molding plastics without departing from the scope of the invention. The pots provided by the plunger bores are not limited to those formed in the lower mold; such pots can be formed also in the upper mold or both in the upper mold and in the lower mold.

What is claimed is:

1. In a method of simultaneously molding a plurality of plastic articles in a mold having a plurality of cavities, the improvement wherein said mold comprises a plurality of bores, each bore forming a pot located adjacent a respective mold cavity, each pot being adapted to hold plastics material for injecting directly into said mold cavity by means of a plunger moveable in said pot, said mold being free of runners and gates, and wherein said method comprises injecting the plastics material directly into each cavity from said pot located adjacent its respective cavity, said pot being directly opened to and communicating with said cavity, such that the plastics material is injected directly thereinto without passing through a runner or a gate.

2. In a molding apparatus including an upper mold and a lower mold having molding surfaces having mating depressions therein forming a plurality of molding cavities, and means for injecting a plastics molding material into said cavities; the improvement wherein said injecting means comprises a plurality of plungers, each plunger being associated with one of said cavities and moveable in a bore, said bore at one end being directly opened to and communicating with said cavity, said open end of each bore serving as a separate pot for each cavity from which pot plastics material is directly injectable into its adjacent cavity without passing through a gate, said apparatus being free of a main runner, auxiliary runners, cull portion, and gates.

3. Molding apparatus according to claim 2 further comprising hydraulic means for actuating said plungers, said hydraulic means comprising oil inlet means for supplying oil simultaneously to all of said plungers to simultaneously actuate said plungers.

4. Molding apparatus according to claim 2 wherein each of said plungers terminates in an end portion approximately in conformity with the shape and size of the cavity associated therewith, said end portion being at the end of said plunger adjacent said cavity.

5. Molding apparatus according to claim 4 wherein said end portion comprises a block member removeably connected to said plunger.

* * * * *